United States Patent
Morris (10) Patent No.: US 10,888,011 B2
(45) Date of Patent: Jan. 5, 2021

(54) MODULAR APPARATUSES AND SYSTEM FOR BACKPLANE CONNECTIONS

(71) Applicant: HEWLETT PACKARD ENTERPRISE DEVELOPMENT LP, Houston, TX (US)

(72) Inventor: Terrel L Morris, Garland, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 119 days.

(21) Appl. No.: 15/521,616

(22) PCT Filed: Oct. 27, 2014

(86) PCT No.: PCT/US2014/062388
§ 371 (c)(1),
(2) Date: Apr. 24, 2017

(87) PCT Pub. No.: WO2016/068843
PCT Pub. Date: May 6, 2016

(65) Prior Publication Data
US 2017/0245388 A1    Aug. 24, 2017

(51) Int. Cl.
*H05K 5/00* (2006.01)
*H05K 1/18* (2006.01)
(Continued)

(52) U.S. Cl.
CPC .......... *H05K 7/1459* (2013.01); *H05K 1/117* (2013.01); *H05K 1/181* (2013.01); *H05K 7/023* (2013.01);
(Continued)

(58) Field of Classification Search
CPC . H05K 2201/09754; H05K 2201/0999; H05K 5/006; H05K 1/14; H05K 1/142;
(Continued)

(56) References Cited

U.S. PATENT DOCUMENTS 5,699,235 A * 12/1997 Tsurumiya et al. ........................ H05K 1/0265
361/803
5,937,133 A    8/1999 Moss et al.
(Continued)

OTHER PUBLICATIONS

PCT/ISA/KR, International Search Report, dated Jul. 27, 2015, PCT/US2014/062388.
(Continued)

*Primary Examiner* — Binh B Tran
(74) *Attorney, Agent, or Firm* — Nolte Intellectual Property Law Group (57) ABSTRACT

A network packaging system can include a circuit board that includes a chip located substantially in a center of the board. A backplane is in communication with the chip and located along on a first edge of the circuit board. A plurality of connector ports are arranged along the perimeter of at least two other edges of the circuit board. A plurality of traces connects the plurality of connector ports to the chip. A support structure houses one or more circuit boards, with at least two sidewall surfaces of the support structure extending substantially orthogonal to and coextensive with each of the at least two edges of the circuit board. The support structure includes a plurality of apertures extending through the one or more surfaces spatially aligned with each of the plurality of connector ports.

20 Claims, 5 Drawing Sheets (51) Int. Cl.
  *H05K 7/14* (2006.01)
  *H05K 1/11* (2006.01)
  *H05K 7/02* (2006.01)
  *H05K 7/00* (2006.01)

(52) U.S. Cl.
  CPC ......... *H05K 7/1427* (2013.01); *H05K 7/1451* (2013.01); *H05K 7/1452* (2013.01); *H01L 2924/0002* (2013.01)

(58) Field of Classification Search
  CPC ........ H05K 1/141; H05K 5/00; H05K 5/0026; H05K 5/0069; H01R 23/68; H01R 23/6893; G06F 1/184; B60R 16/0239
  USPC ....... 361/748, 752, 760, 764, 783, 785, 788, 361/792, 796; 174/50, 50.5, 50.52
  See application file for complete search history.

(56) References Cited

U.S. PATENT DOCUMENTS

| | | | |
|---|---|---|---|
| 6,233,376 B1 | 5/2001 | Updegrove | |
| 6,456,495 B1* | 9/2002 | Wieloch et al. | H05K 7/1468 361/729 |
| 6,547,445 B2 | 4/2003 | Kiani | |
| 6,643,141 B2* | 11/2003 | Kaetsu et al. | H04Q 1/10 361/797 |
| 2004/0100782 A1 | 5/2004 | Bozso et al. | |
| 2008/0253085 A1 | 10/2008 | Soffer | |
| 2008/0257594 A1 | 10/2008 | Engblom et al. | |
| 2009/0284299 A1 | 11/2009 | Izumi | |
| 2012/0243160 A1 | 9/2012 | Nginen et al. | |
| 2014/0003774 A1 | 1/2014 | Schriel et al. | |

OTHER PUBLICATIONS

Vicich, B. et al., Design and Application of an Optical Backplane Connection System, Retrieved from the Internet on Aug. 26, 2014, <https://www samtec com/documents/webfiles/Technical Library/ DesignConn2007010807.pdf.

* cited by examiner

FIG. 9

MODULAR APPARATUSES AND SYSTEM FOR BACKPLANE CONNECTIONS

BACKGROUND

Switch chips can refer to high pin-count devices, having several hundreds and sometime thousands of package connections. Consequently, the signal routing area of a chip package can be extraordinarily dense, often requiring many layers in order to "escape" the pattern on the circuit board to which the chip is attached. The issue of increased density is further complicated by the trend of increasing signal data rates and the desire for low-power operation.

DETAILED DESCRIPTION

This disclosure relates to apparatuses and systems to provide for input/output connections, such as for networking components. As an example, a modular apparatus includes a circuit board that utilizes at least two available edges of the circuit board for connector ports and another edge to provide a backplane interface with connectors to connect to a backplane (e.g., an optical and/or electrical backplane). By implementing a backplane interface at one edge and connector ports at two or more other edges surrounding an integrated circuit (IC) chip, such as a switch chip, the overall number of connections can be increased and the length of the longest circuit trace routing between the chip and the connector ports can be decreased. This decrease in routing distance can be significant when physical layer specifications require the longest physical routing distance to be less than a predetermined distance. For example, the module can be a line card that include switch chip to provide for packet switching or circuit switching in a communications network.

Additionally, each circuit board further can be housed in an enclosure that exposes its backplane interface and connector ports along its edges to facilitate stacking enclosures. By configuring the modules as to be stackable, a plurality of such modules further can be arranged connected together (e.g., physically and communicatively) along a vertical axis (e.g., a plurality of vertically-stacked circuit modules together). This arrangement can increase the effectiveness of system topology, circuit board routing, physical networking connectivity to all four sides of a circuit board as well as result in achieving increased faceplate density, and providing an intrinsic cable management solution. The systems and methods disclosed here can be implemented to provide for optical connectivity and/or electrical connectivity between respective connection ports and associated cabling. In such a vertically stacked arrangement, the connector ports for each module can remain accessible to insertable connections from all its sides while the module is connected to the backplane (e.g., optical and/or electrical backplane). The vertically stacked arrangement of the circuit board modules thus can produce a high-radix switch system can be accomplished. Additionally, if two vertically stacked arrangements of modules are implemented next to each other (e.g., in a rack or otherwise attached to a panel), the space between an adjacent pair of side edges of the two stacks provides a convenient space for cabling to reside, thereby operating as a passage for cable management.

In an example network package system, an IC chip is placed on or near the center of the circuit board and the chip connects to a board edge connector via circuit traces on the circuit board. Thus, the number of ports at a board edge connector that can be utilized is a function of the area of the faceplate of the circuit board. For high pin-count networking cards (e.g., about 400 pins), circuit traces can be routed to take a shortest possible path from the chip to the connector ports on the circuit board to which the chip is attached in order to ensure high signal fidelity. By arranging the connector ports in substantially equal spacing along multiple edge of a circuit board, the traces can be routed outward from the package center in a substantially radial pattern as to ensure a consistently short path length to each port. For a circuit board with connector ports located at every available side (e.g., connector ports on three sides of a four-sided circuit board), the path of the circuit board traces more closely follows the most direct connection port. As a result, routes running in a more direct point-to-point connectivity can be accomplished with a shorter trace length, and electrical signaling can be achieved within a more stringent set of specifications. For example, the modular apparatus thus can include an increased number of connector ports compared to traditional cards with connector ports along a single side while still maintaining shorter trace lengths in compliance with strict industry standards, such as very short reach (VSR) and ultra short reach (USR) physical and link layer standards provided by the Optical Internetworking Forum (OIF).

Figure 1:
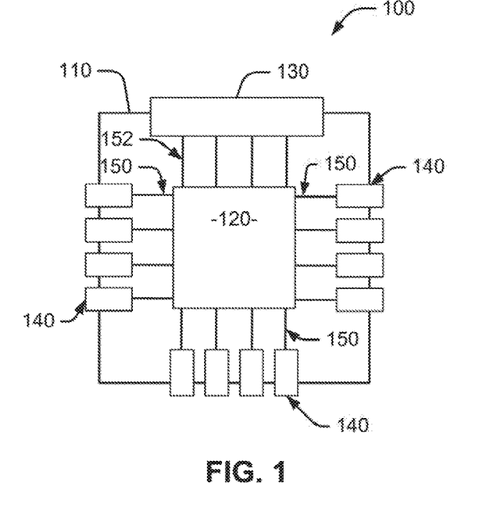
FIG. 1 illustrates an example of a circuit board.

FIG. 1 illustrates an example of a modular apparatus 100 that includes a circuit board 110 to support one or more IC chips 120. The circuit board 110 includes a plurality of ports 140 to provide connectivity to external networks and devices. The circuit board 110 can be, for example, a printed circuit board (PCB). The circuit board 110 can be a single sided, a double sided, or a multi-layer board.

The circuit board 110 mechanically supports and electrically connects electronic components, such as the chip 120 and the connector ports 140, using, for example, electrically conductive traces 150. Conductors on the different layers of the circuit board 110 can be connected by electrically conductive vias (e.g., vertical connectors) that traverse the one or more layers. In addition to the chip 120, connector ports 140 and conductive traces 150, the circuit board 110 may contain other circuitry (not shown), such as capacitors, resistors or active devices, analog devices, digital circuits and other ICs. Such other circuitry can be mounted on a surface of the circuit board and/or can be embedded in a substrate of the circuit board 110, for example.

The chip 120 can be, for example, an integrated circuit (also referred to as an IC or a microchip), such as an application-specific integrated circuit (ASIC) or other general purpose IC. The conductive traces 150 on the circuit board 110 can be implemented of an electrically conductive material, such as copper, aluminum, gold or the like via depositing the material during fabrication of the circuit board 110. Signal traces for communicating information are often thinner than power or ground traces as their current carrying requirements may be relatively small, as the resistance of a trace is determined by the width and thickness of the trace.

The circuit board 110 includes a backplane interface 110, which can be located along one of the edges of the board. The backplane interface 130 includes a group of one or more connectors. In one example, the connectors can be electrically conductive connectors in parallel with each other, so that a pin of each connector is linked to the same relative pin of all the other connectors connected with the backplane. In other examples, the connectors in the backplane interface 130 can be optical connectors to provide a path for optical signals (e.g., light) to be transmitted to and/or received from the backplane. The backplane interface 130 thus can be used as a backbone to connect several circuit boards 110 to a common backplane. Each circuit board can include a respective backplane that can be connected to a set of connections to provide an aggregate computing or networking system.

For example, a panel of a communications system may have a backplane to attach swappable networking cards, such as the circuit board 110 described herein. The backplane interface 130 thus can include a plurality of pins that pass directly into respective sockets without requiring cables. As a further example, for a storage application, the backplane interface 130 may have a single connector to connect one disk array controller, or may be fitted with multiple connectors that can be connected to one or more controllers.

In the example of FIG. 1, the backplane interface 130 is connected to the chip 120 by a plurality of traces 152. The traces 152 can include a set of traces designed to communicate information and one or more power traces designed for providing electrical power from the backplane to the circuit board 110 and its components, including the IC chip 120. In some examples, the circuit board 110 is a high speed line card (e.g., digital line card) to route signals between connector ports or between connector ports and the backplane interface. The backplane interlace 130 can be configured to connect to a corresponding backplane, which can be an optical backplane and/or an electrical backplane according to application requirements.

In order to reduce trace lengths, board traces 150 and 152 can follow a radial pattern, e.g., emanating outward from the chip 120 located at the central region of the circuit board 110 to the respective connector ports 140 and to backplane interface 130. Accordingly, the radial pattern provides a shorter trace length and more efficiently utilizes the area available on a circuit board 110, which can be necessary to comply with common electrical interface standards physical and link layer signaling. The examples illustrated thus reduce the need for additional circuit layers that would increase manufacturing expense and complexity. Further, as signal integrity degrades with added length and by traversing vias, limiting the trace distance and vertical transmission helps to ensure greater signal fidelity. Given the consistent distance from the chip 120 to each connection port 140, whether electrical or optical, the number of connection ports 140 that can be successfully utilized is a function of the spatial area of the circuit board 110.

The connection ports 140 can be a female connector port for insertion of a male end connector or, alternatively, the ports can be male ends for insertion into a corresponding female end of a cable. In the example of FIG. 1, the circuit board 110 is in the shape of a rectangle, such that the backplane interface 130 occupies one edge of the circuit board 110. The backplane interface 130 can be attached to a corresponding backplane connector (e.g., in a rack or other support structure containing the backplane). The remaining three edges of the circuit board 110 include corresponding ports that are accessible along the respective edges. That is, a support structure (see, e.g., FIG. 4) can support the circuit board 110 in its connection to the backplane while concurrently ensuring access to the connection ports 140 located along the other edges of the circuit board 110

Thus, as provided in FIG. 1, the available surface area of the circuit board 110 is efficiently utilized for routing traces 150 to connector ports 140. The circuit board provides for connection to a backplane while maintaining access to each side of the circuit board 110. Due to the configuration of the ports along a plurality of different edges of the board, the surface area of the circuit board 11 can be efficiently utilized to enable shortened trace routes (e.g., in compliance with industry standards for high speed electrical interfaces) and increase the number of connections that can be provided within a given area of the circuit board 110.

Figure 2:
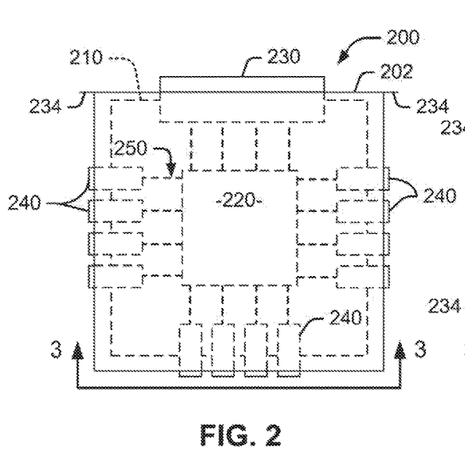
FIG. 2 illustrates an example of a modular circuit apparatus within an enclosure.
Figure 3A:
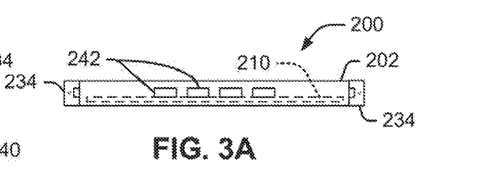
FIG. 3A illustrates a side view of the circuit board of FIG. 2 taken along line 3-3 for a first example embedment.
Figure 3B:
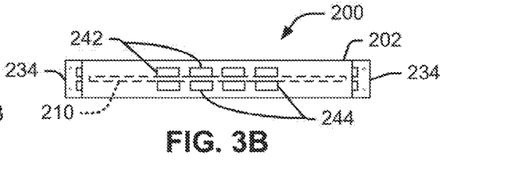
FIG. 3B illustrates a side view of the circuit board of FIG. 2 taken along line 3-3 for another example embodiment.

FIGS. 2, 3A and 3B illustrate schematic examples of a modular apparatus 200 that includes a circuit board 210 housed within an enclosure 202. For sake of illustration, various the parts of the circuit board and ports are not drawn to scale and interior contents of the enclosure are identified with a dotted line to reveal the features encased therein. The circuit board 210 can be enveloped within the enclosure 202 to provide structure and protection for the chip 220, electromagnetic interference (EMI) containment, and can introduce airflow holes for cooling. The enclosure 202 can also provide support for the circuit board 210 and the weight of associated cables by being fitted with shelves or grooves. Additionally, the enclosure provides three-sided access to the connection ports, including when mounted to a rack or other support structure. In some examples, the circuit board 210 can be removable from and insertable within the enclosure 202. In the enclosure, vertical stacking of a plurality of modules 200 is facilitated, such that a plurality of the modular apparatuses can be arranged in a vertical stack mounted in a rack or other support structure.

As shown, the removable enclosure 202 substantially envelopes the components of the circuit board 210, including chip 220, traces 250, backplane interface 230 and a plurality of connector ports 240. Additionally, the removable enclosure 202 can be designed to allow access to the backplane interface 230 and each of the plurality of connector ports 240 when the modular apparatus has been installed in a support structure of a communications system. Thus, the removable enclosure 202 provides structure and protection for the circuit board 210 while maintaining accessibility to the connector ports 240 located thereon during use. A distal end of the enclosure 202 at the backplane edge of the circuit board 210 includes mounting tabs 234 that can be utilized to secure the enclosure to a support structure, such as via one or more fasteners (e.g., screws, mounting pins latches and the like), for example.

FIGS. 3A and 3B illustrate a cross sectional view of the modular apparatus 200 of FIG. 2 taken along line 3-3 for two different example configurations. In each example, the board 210 is encased in an opaque enclosure 202. Connector ports 242 and 244 are accessible through openings in the enclosure 202 along the respective edges.

In the example of FIG. 3A, the connector ports 242 are arranged along the edge in a single row. For instance, each connector port can be mounted to a common surface (e.g., an upper or lower surface) of the circuit board 210. As disclosed herein, each port 242 can be adapted to provide for signal communications along one or more physical channels, which can be optical or electrical. Each of the mounting tabs 234 can include one or more aperture into which corresponding mounting fasteners can be provided to secure the module 200 to a rack or other support structure.

In the example of FIG. 3B, circuit board 210 is demonstrated as including at least two layers, and thus includes two parallel rows of connector ports 242 and 244 along each of the edges along the perimeter extending between ends of the backplane edge. For instance, the connector ports 242 can be mounted to a first surface layer of the circuit board 210, and the connector ports 244 can be mounted and extend from a second surface layer of the board. Thus, the modular apparatus 200 includes two separate rows of connector ports along each of its edges. Accordingly, each layer of a multilayer circuit board can include traces to provide connections to a plurality of connector ports, thereby increasing the number of connector ports available on the circuit board 210 relative to traditional types of circuit modules (e.g., line cards, switch cards, router cards, controller cards, and the like).

Figure 4:
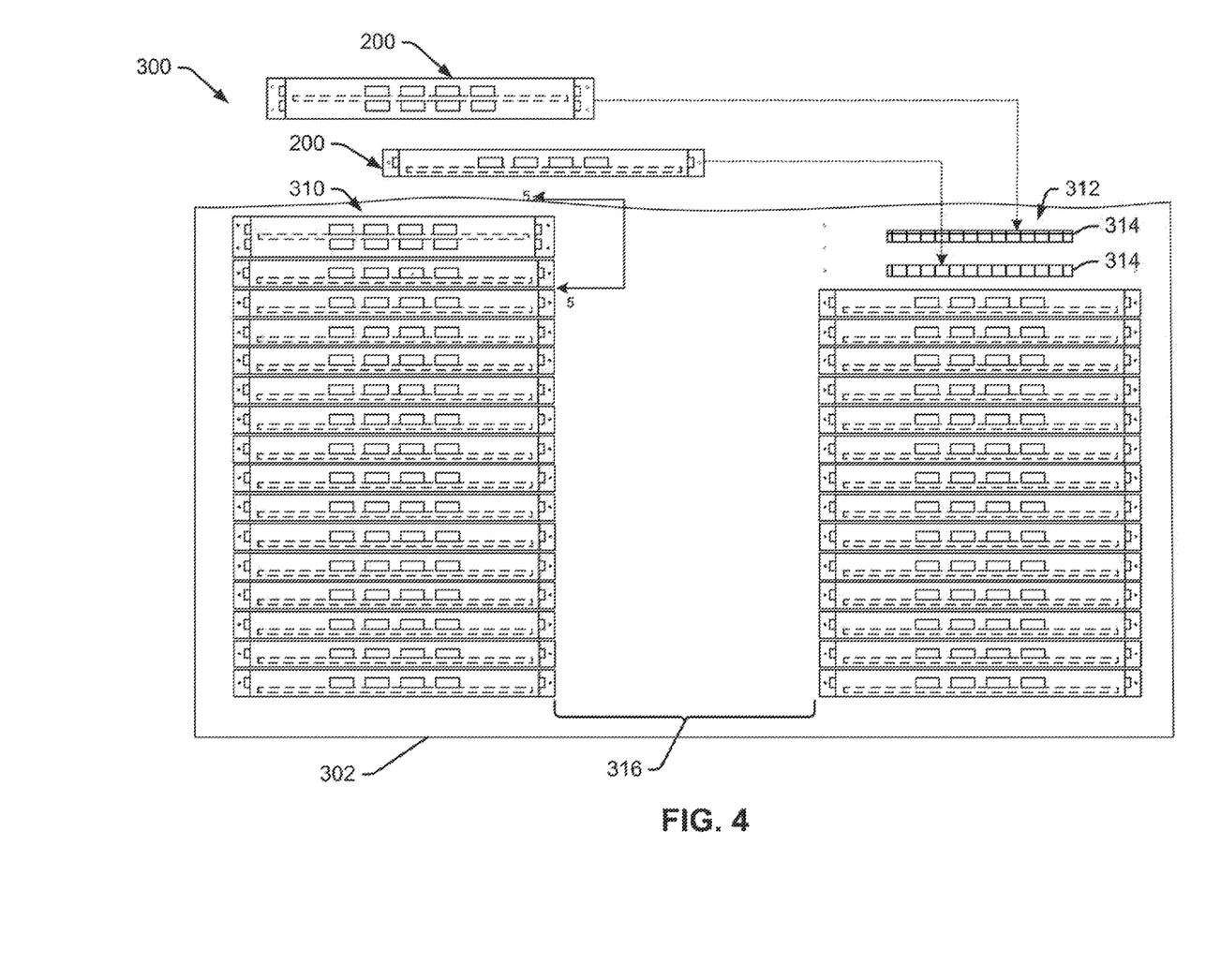
FIG. 4 illustrates an example of a system that includes an arrangement of modular circuit apparatuses.

FIG. 4 illustrates an example of a system 300 that includes a plurality of modular apparatuses 200, which can include one or more of the different types of modular apparatuses demonstrated with respect to FIGS. 2, 3A and 3B. That is the modular apparatus 200 in the system can include a single row of connector ports along its edges or it can include more than one parallel row of connector ports. For example, the system 300 includes a support structure 302, such as can correspond to a chassis (e.g., a rack). The support structure 302 can include a plurality of backplane connectors 314 configured to mate and connect with backplane interfaces of each of the modular apparatuses 200. As one example, the backplane connectors include female receptacles to receive male connectors of the backplane interface 230. The type and configuration of connectors 314 can vary depending on application requirements. The backplane connectors 314 can thus interconnect the backplane interface of each connected modular apparatus to a corresponding backplane (e.g., electrical and/or optical backplane). The support structure 302 can also include respective boreholes or pins dimensioned and configured to align with corresponding features in the mounting tabs 234 of each modular apparatus.

As demonstrated in the example of FIG. 4, the system 300 includes a first vertically stacked arrangement of modular apparatuses, demonstrated at 310, located next to another vertically stacked arrangement of modular apparatuses, demonstrated at 312. Each of the vertical stacks can include the same or different number and/or types of modular apparatuses. An adjacent pair of edges for the modules in each column thus defines an interstitial space 316 therebetween. The interstitial space 316 between each vertical stack 310 and 312 thus forms a passage that can be used for cooling and cable management. For example, cables can be connected to connector ports along each of the edges of the respective modules, and cables connected to connector ports along edges at the interstitial space 316 can travel conveniently from the connector port within such space (see, e.g., FIG. 5).

In the example of FIG. 4, each modular apparatus is demonstrated as having a generally rectangular shape, such as disclosed with respect to FIGS. 1-3. In other examples, alternative geometries for the circuit boards and enclosure can be provided, such as triangular, circular, hexagonal, etc. Accordingly, the shape of the housing structures 362 and 364 would correspond to the selected alternative geometric shape of the circuit board.

In the example of FIG. 4, one or more circuit boards, corresponding to circuit boards 110 of FIG. 1 or boards 210 of FIG. 2, can be mounted to a mounting structure. As shown, each of the circuit boards 210 can be mounted while residing in its respective enclosure (e.g., enclosure 202 of FIG. 2, 3A or 3B). As another example, each of the circuit boards can be mounted to the panel 302 (by connecting the backplane interface with the backplane connector 314) prior to housing the circuit boards within their enclosures. In this situation, the removable enclosure can be attached to the panel 302 following installation of the circuit boards 200. In either situation, once installed in the panel 302, the connection ports 230 of the circuit boards remain accessible from each side of each surface of the module while mounted in the panel 302.

Figure 5:
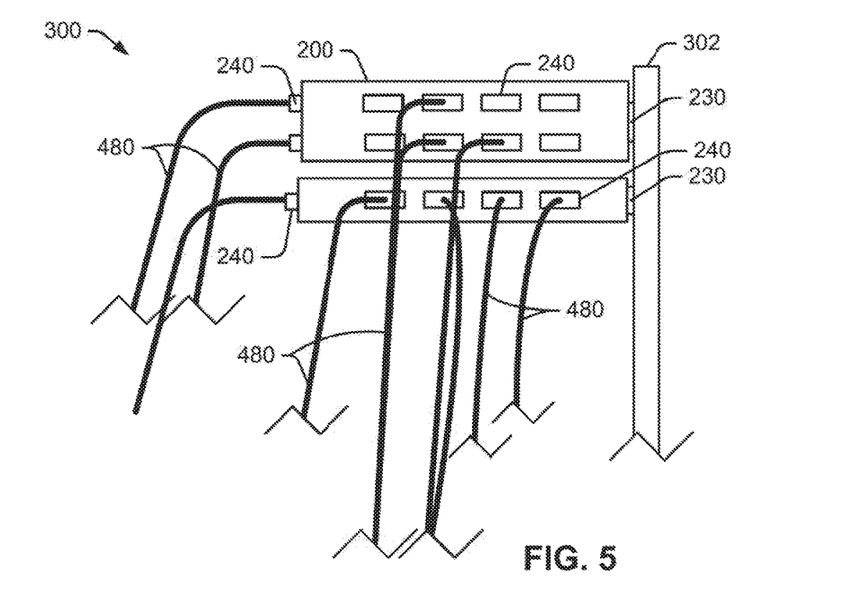
FIG. 5 illustrates a cross-sectional view of part of a system demonstrating cables connected to various ports.

FIG. 5 illustrates a partial cross sectional view of an example packaging system along the line indicated by 5-5 in FIG. 4 demonstrating a side view of a set of the modular apparatuses 200. In the example of FIG. 5, each of the modular apparatuses 200 are part of the column 310 of vertically stacked modules. Each modular apparatus 200 includes a backplane interface 230 that is connected to respective backplane connections at the panel 302. Each circuit board 210 includes a plurality of connector ports 240 that are encased in and accessible through its respective enclosure, such as provided in the side view 208 of FIG. 2. As demonstrated in the example, one or more cables 480 can be connected to one or more (up to and including all) of the connector ports 240. The cables 480 can connect to other connector ports, for example, which may be in a module that is located in the same column 310 or another location. The cables 480 extending from the side of the modules facing and extending into the space 316 between vertical stacks of modules can be conveniently managed and traverse such space.

FIG. 5 shows how circuit modules 200 may be stacked to provide rear attachment to a common backplane. In this case, the surface area added by the ports implemented along a plurality of edges provides opportunities for access to connector ports 240 of the networking packages housed therein while also maintaining the distance of electrical traces between chips and the connection ports within a predetermined distance (e.g., less than about 100 mm or other interface standard distances). As disclosed herein, the backplane and corresponding backplane interfaces 230 and respective connectors can implement electrical or optical connections. Each set of circuit board modules 200 thus can be plugged into an optical or electrical backplane, while also affording multi-sided access to connector ports 240.

Networking cable management becomes significantly more challenging as the capabilities and radix of switch products increase as the number of connectors increases. For example, cables coming off a high-density faceplate create a "cable waterfall" that requires management solutions in order to facilitate routing, prevent damage, and facilitate service actions. The interstitial space between adjacent columns of vertically stacked circuit modules 200 provides a convenient passage to manage the cables 480. The space between pairs of side edges (e.g., the space 316 of FIG. 4)

provides convenient passages for egress and routing of cables 480, as well as for separating cables 480 into specific runs down the system chassis. It should be noted that the specific sizes and size ratios of the circuit boards 210, as well as the passages between stacks of circuit boards 210, can be adjusted to achieve a desired configuration. As one example, the distance between side edges of the respective columns of modules can approximate the distance between opposing lateral side edges the module. Other distances can be used as according to application requirements, such as to facilitate access to connection ports and cables attached at such ports. Cable bars and cable ties may also be incorporated in this application.

Figure 6:
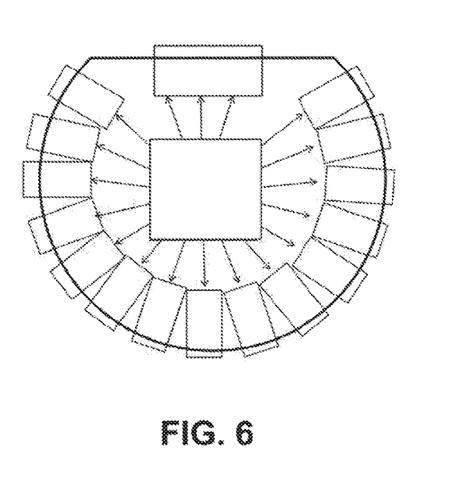
FIG. 6 illustrates another example of a modular circuit apparatus.
Figure 7:
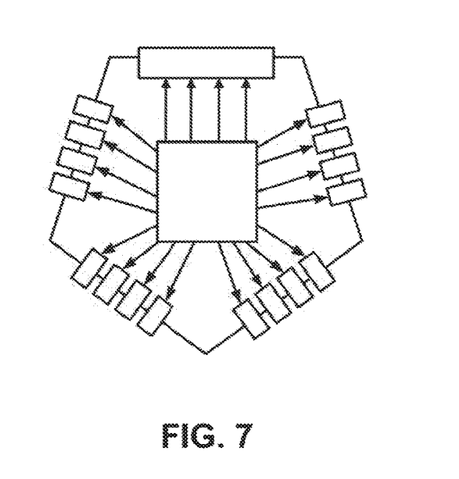
FIG. 7 illustrates yet another example of a modular circuit apparatus.

FIGS. 6 and 7 illustrate alternative circuit board shapes for installation with the packaging system described herein. FIG. 6 shows a generally circular circuit board having a flat edge on which to locate a backplane connector. The arc perimeter of the generally circular circuit board is arranged with a plurality of connector ports along the edge. As such, a housing structure of the support structure would take a shape similar to that of the circuit board to allow access to each connection port once installed therein. Variations on the generally circular circuit board are also considered, such as a half circle, a full circle where one or more connector ports are replaced by a backplane connector, or a combination of circular and other geometric shapes. FIG. 7 shows another example circuit board in the shape of a polygon, namely a pentagon. As illustrated, each circuit board has a centrally located chip mounted thereon, and a plurality of connector ports arranged around a perimeter surrounding chip. As disclosed with respect to other example circuit modules, a path of each trace routed from the chip to each connector port can be maintained with a predetermined distance, such as to comply with industry standards and ensure sufficient signal quality. Accordingly, each trace is substantially directly routed generally radially from the chip to a corresponding connector port.

Figure 8:
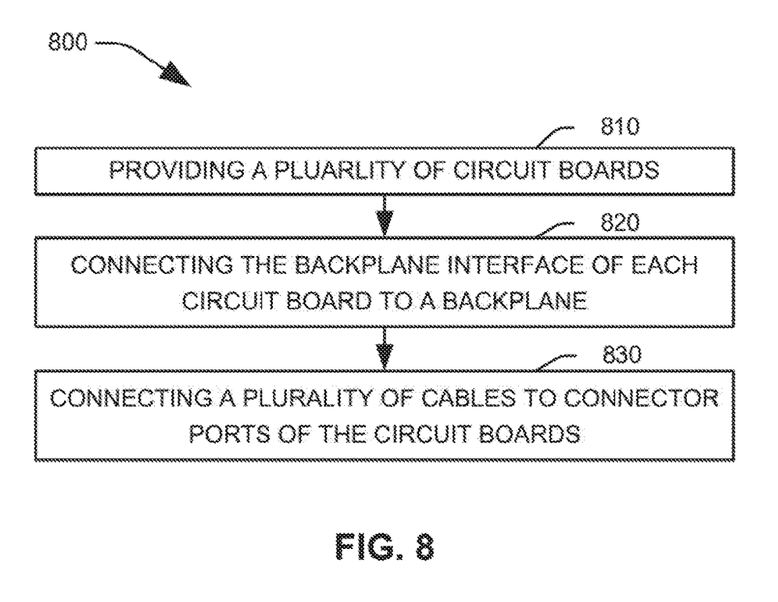
FIG. 8 is a flow diagram illustrating an example of a method to connect components with a backplane.

In view of the foregoing structural and functional features described above, example methods of making a system the package system 300 of FIG. 4) will be better appreciated with reference to FIG. 8. In the method of FIG. 8, various types of process parameters can be utilized at various steps according to application requirements and the structures being fabricated and materials used in such fabrication. While, for purposes of simplicity of explanation, the methods of FIG. 8 are shown and described as executing serially, the methods are not limited by the illustrated order, as some actions could in other examples occur in different orders and/or concurrently from that shown and described herein.

FIG. 8 describes one example of a method 800 of using modules, such as circuit board modules disclosed herein (see FIGS. 1-7). The method described in FIG. 8 begins at 810 by providing one or more circuit boards (circuit boards 110 and 210) for installation in the system. As disclosed herein, each circuit board can include a backplane interface and connector ports along its perimeter edges to maintain the longest distance of electrical traces from and IC chip to the connector ports within a predetermined distance, as disclosed herein.

At 820, the method includes connecting a backplane interface of each of a plurality of circuit modules to a backplane of communication system. For instance, each of the plurality of circuit modules can be arranged together with a longitudinal axis extending through a circuit board of each of the plurality of circuit modules, such as to provide a corresponding vertical stack of such modules (see, e.g., FIGS. 4 and 5). Each circuit board can be mounted within an enclosure prior to being connected to backplane or the enclosure can be applied after the circuit board is mounted.

At 830, the method 800 can include connecting a plurality of cables to the connector ports of at least some of the plurality of circuit modules such that the cables extend along side edges of the plurality of circuit modules (see, e.g., cables 480 of FIG. 5). The method thus can provide a system (e.g., system 300), such as described herein, where the circuit board provides integration with the support structure to maintaining access to each connector port on each available side of the circuit board once installed.

Figure 9:
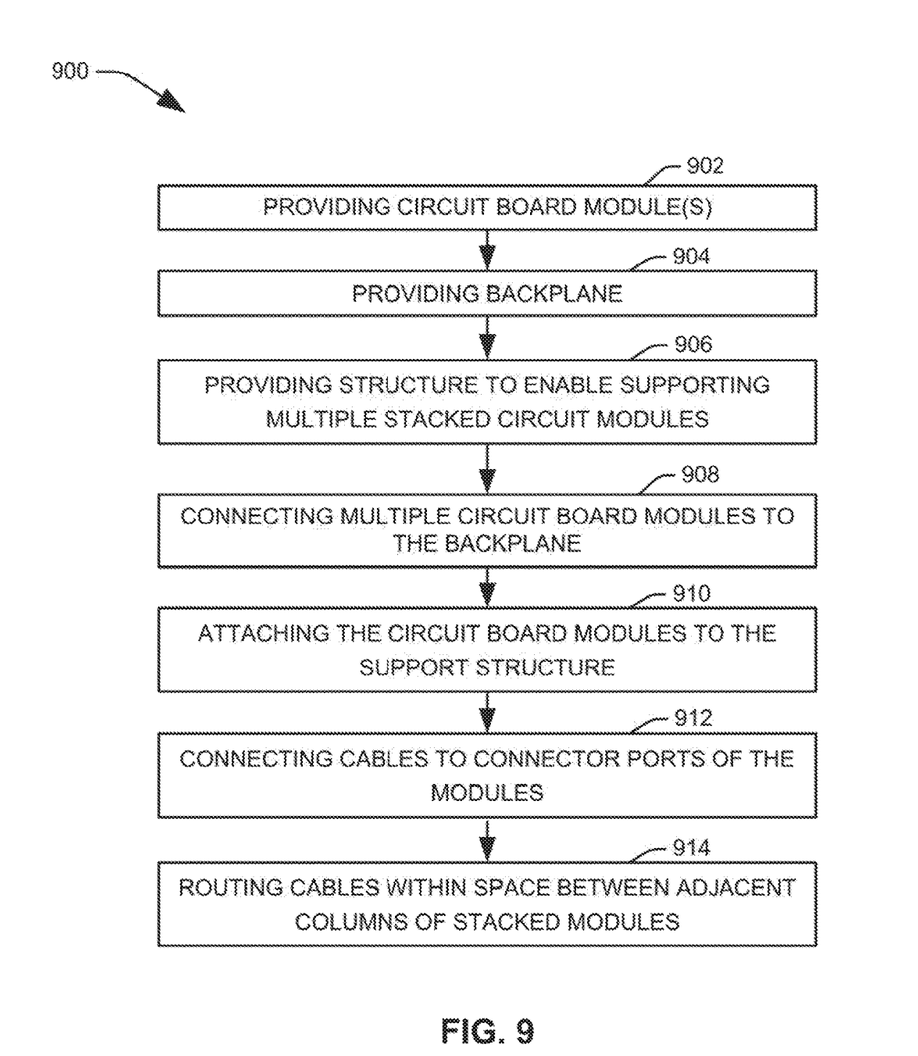
FIG. 9 is a flow diagram illustrating an example of another method connect components with a backplane.

FIG. 9 depicts an example of another method 900 that can be implemented. At 902, the method includes providing one or more circuit board modules (e.g., module 200), which includes a circuit board, such as a circuit card, enclosed within in housing. The board includes a central chip, a backplane connector, and port connectors along at least two sides (see, e.g., FIG. 1, 6 or 7).

At 904, the method includes providing a backplane for multiple connections of vertically stacked circuit board modules (e.g., backplane connections 314 of FIG. 4). At 906, the method can include providing a structure (e.g., the panel 302) that is dimensioned and configured to enable physically supporting a multiplicity of stacked circuit board modules and providing space between adjacent vertical stacks of modules. The space between stacks can facilitate cable routing from connector ports along side edges of a given module to another port that is external to the given circuit module (e.g., another module). At 908, the method can include connecting multiple circuit board modules to the backplane (see, e.g., FIG. 4). At 910, the circuit board modules can be attached to the support structure (e.g., via fasteners, such as threaded fasteners, clips, pins or the like). At 912, the method includes connecting cables to at least some of the connector ports of each of the stacked circuit board modules. At 914, cables mounted to ports along side edges can be routed in the space between the stacks of modules.

Furthermore, relative terms used to describe the structural features of the figures illustrated herein, such as above and below, up and down, first and second, near and far, etc., are in no way limiting to conceivable implementations. For instance, where examples of the structure described herein are described in terms consistent with the figures being described, and actual structures can be viewed from a different perspective, such that above and below may be inverted, e.g., below and above, or placed on a side, e.g., left and right, etc. Such alternatives are fully embraced and explained by the figures and description provided herein.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An apparatus comprising:
    a circuit board comprising:
        an integrated circuit (IC) chip located substantially in a central region of the circuit board;
        a backplane interface in communication with the IC chip and located along a backplane edge of the circuit board;
        a plurality of connector ports arranged along the perimeter of at least two other edges of the circuit board; and
        a plurality of traces connecting each of the plurality of connector ports to the IC chip, a length of each of the plurality of traces being less than a predetermined distance; and
    a respective enclosure that envelopes the circuit board, the respective enclosure comprising first and second opposing sidewalls and a substantially planar back wall extending orthogonally relative to the first and second opposing sidewalls and an entire portion of the substantially planar back wall extending planarly from the first sidewall to the second sidewall, the backplane interface and each of the plurality of connector ports being exposed to provide access through the respective enclosure such that when the backplane interface is connected to a backplane, the entire portion of the substantially planar back wall extending planarly from the first sidewall to the second sidewall of the respective enclosure is spaced forward of the backplane.

2. The apparatus of claim 1, wherein at least a portion of the backplane interface extends rearwardly past the back wall of the respective enclosure such that the backplane interface is exposed to provide access through the respective enclosure.

3. The apparatus of claim 1, wherein the respective enclosure comprises one or more mounting tabs along the back wall thereof extending laterally past one of the first and second sidewalls to mount the respective enclosure at a panel that includes a backplane connection for the backplane interface.

4. A system comprising:
    a plurality of the apparatus of claim 1, the respective enclosure of each of the plurality of apparatuses being stacked together along a longitudinal axis such that the backplane edge of each of the plurality of apparatuses are aligned to define a substantially planar backplane surface and each of the at least two other edges are aligned to define substantially planar edge surfaces.

5. The system of claim 4, wherein the backplane interface of each of the plurality of apparatuses is connected to a common backplane.

6. The system of claim 5, further comprising a plurality of cables connected to the plurality of connector ports of at least some of the plurality of apparatuses.

7. The system of claim 5, wherein the common backplane comprises at least one of an optical backplane and an electrical backplane.

8. The apparatus of claim 1, the circuit board comprises a multilayer circuit board, wherein one or more connector ports of the plurality of connector ports are arranged on a perimeter of at least two edges of a given layer of the multilayer circuit board and one or more other connector ports of the plurality of connector ports are arranged on a perimeter of at least two edges of another layer of the multilayer circuit board, whereby at least two rows of connector ports are provided along at least one edge.

9. The apparatus of claim 1, wherein a perimeter of the circuit board extending between spaced apart ends of the backplane edge is in a shape of one of a polygon or a semi-circle.

10. The apparatus of claim 1, wherein the IC chip is to route communications selectively between the connector ports or between the connector ports and the backplane interface.

11. A system comprising:
    a plurality of modular circuit apparatuses, each modular circuit apparatus comprising:
        a printed circuit board;
        an integrated circuit (IC) chip mounted in a central region of the circuit board;
        a backplane interface in communication with the IC chip and located along a backplane edge of the circuit board;
        a plurality of connector ports arranged along the perimeter of at least two other edges of the circuit board;
        a plurality of traces connecting each of the plurality of connector ports to the IC chip, a length of each of the plurality of traces being less than a predetermined distance; and
        a respective enclosure that houses the circuit board, the respective enclosure comprising first and second opposing sidewalls and a substantially planar back wall extending orthogonally relative to the first and second opposing sidewalls and an entire portion of the substantially planar back wall extending planarly from the first sidewall to the second sidewall, the backplane interface and each of the plurality of connector ports being exposed to provide access through the respective enclosure; and
    each of the plurality of modular circuit apparatuses being stacked together along a longitudinal axis such that the backplane edge of each of the plurality of modular circuit apparatuses are aligned to define a substantially planar backplane surface and each of the at least two other edges are aligned to define substantially planar edge surfaces, the backplane interface of each of the plurality of modular circuit apparatuses being connected to a common backplane such that the entire substantially planar backplane surface of the aligned plurality of modular circuit apparatuses is spaced forward of the common backplane.

12. The system of claim 11, wherein each respective enclosure comprises one or more mounting tabs along the back wall thereof extending laterally past one of the first and second sidewalls to mount the respective enclosure at a panel that includes a backplane connection for the backplane interface.

13. The system of claim 11, wherein the common backplane comprises at least one of an optical backplane and an electrical backplane.

14. The system of claim 11, wherein at least two rows of connector ports are arranged along at least one edge of each respective circuit board.

15. A method comprising:
    connecting a backplane interface of each of a plurality of circuit modules to a backplane of a communication system, each of the plurality of circuit modules being arranged together with a longitudinal axis extending through a circuit board of each of the plurality of circuit modules, each circuit module comprising:
        a printed circuit board;
        an integrated circuit (IC) chip mounted in a central region of the circuit board;

the backplane interface in communication with the IC chip and located along a backplane edge of the circuit board;

a plurality of connector ports arranged along the perimeter of at least two other edges of the circuit board;

a plurality of traces connecting each of the plurality of connector ports to the IC chip, a length of each of the plurality of traces being less than a predetermined distance; and a respective enclosure that houses the circuit board, the respective enclosure comprising first and second opposing sidewalls and a substantially planar back wall extending orthogonally relative to the first and second opposing sidewalls and an entire portion of the substantially planar back wall extending planarly from the first sidewall to the second sidewall, and the backplane interface and each of the plurality of connector ports being exposed through the respective enclosure such that when the backplane interface is connected to a backplane, the entire portion of the substantially planar back wall of the respective enclosure extending planarly from the first sidewall to the second sidewall is spaced forward of the backplane; and connecting a plurality of cables to the connector ports of at least some of the plurality of circuit modules such that the cables extend along side edges of the plurality of circuit modules.

16. The apparatus of claim 1, wherein the backplane interface of the circuit board is connectable to a backplane prior to housing the circuit board with the respective enclosure.

17. The system of claim 11, wherein the backplane interface of at least one modular circuit apparatus is connected to the common backplane prior to housing the respective circuit board of the at least one modular circuit apparatus with the respective enclosure.

18. The system of claim 11, wherein at least a portion of the backplane interface of at least one modular circuit apparatus extends rearwardly past the back wall of the respective enclosure such that the backplane interface is exposed to provide access through the respective enclosure.

19. The method of claim 15, further comprising mounting the respective enclosure of at least one circuit module to a support structure of the communication system with one or more mounting tabs extending along the back wall of the respective enclosure, the one or more mounting tabs extending laterally past one of the first and second sidewalls of the respective enclosure.

20. The method of claim 15, further comprising housing the circuit board of at least one circuit module with the respective enclosure after connecting the backplane interface of the at least one circuit module to the backplane of the communication system.

* * * * *